United States Patent [19]

Kato

[11] Patent Number: 5,442,219
[45] Date of Patent: Aug. 15, 1995

[54] SEMICONDUCTOR DEVICE FOR CONTROLLING ELECTRIC POWER

[75] Inventor: Masaaki Kato, Kariya, Japan

[73] Assignee: Kabushiki Kaisha Toyoda Jidoshokki Seisakusho, Kariya, Japan

[21] Appl. No.: 61,960

[22] Filed: May 14, 1993

[30] Foreign Application Priority Data

May 18, 1992 [JP] Japan .................... 4-124686

[51] Int. Cl.⁶ .................... H01L 27/06; H01L 27/102; H01L 27/105
[52] U.S. Cl. .................... 257/370; 257/378; 257/328; 257/140; 257/577
[58] Field of Search .................... 257/107–109, 257/370, 371, 372, 378, 327, 328, 337, 338, 369, 368, 378, 140, 146, 139, 577

[56] References Cited

U.S. PATENT DOCUMENTS

| | | | |
|---|---|---|---|
| 4,618,872 | 10/1986 | Baliga | 257/140 |
| 4,829,352 | 5/1989 | Popovic et al. | 257/426 |
| 4,908,551 | 3/1990 | Ludikhuize et al. | 315/209 R |
| 4,910,563 | 3/1990 | Tuska et al. | 257/329 |
| 4,912,054 | 3/1990 | Tomassetti | 257/370 |
| 4,921,811 | 5/1990 | Watanabe et al. | 257/370 |
| 4,949,142 | 8/1990 | Contiero et al. | 257/329 |
| 5,065,208 | 11/1991 | Shah et al. | 257/370 |
| 5,105,252 | 4/1992 | Kim et al. | 257/370 |
| 5,200,638 | 4/1993 | Kida et al. | 257/337 |

FOREIGN PATENT DOCUMENTS

| | | | |
|---|---|---|---|
| 0282734 | 9/1988 | European Pat. Off. | 257/370 |
| 0287147 | 10/1988 | European Pat. Off. | |
| 0023472 | 2/1983 | Japan | 257/107 |
| 0089855 | 5/1983 | Japan | 257/370 |

Primary Examiner—Robert P. Limanek
Assistant Examiner—Alexander Oscar Williams
Attorney, Agent, or Firm—Brooks Haidt Haffner & Delahunty

[57] ABSTRACT

A semiconductor device comprises a half-bridge circuit, one of the two arms or elements of which is a thyrister, and the other is a bi-polar transistor. It is structured vertically as a single semiconductor chip with a primary conductor type cathode area of the thyrister and a primary conductor type collector area of the bi-polar transistor shared as common areas. A first isolation area is formed between a intermediate layer of the thyrister and the above described common area. A second isolation area is formed in the first isolation area provided between the intermediate layer of the thyrister and the base area of the bi-polar transistor. Because the upper and lower arms of the half-bridge are vertically structured, the circuit provides for excellent area efficiency, current amplification factor, and current capacity. No specific isolation layers are required to isolate the upper arm from the lower arm. The first and second isolation areas suppress leakage current generated by the formation of incidental npn and pnp structures. Additionally, vertically structured single semiconductor chip half-bridge circuit are described comprising a p-channel IGBT as an upper arm and an n-channel MOS as a lower arm, or comprising a p-channel MOS as an upper arm and an n-channel IGBT as a lower arm.

4 Claims, 14 Drawing Sheets

SEMICONDUCTOR DEVICE FOR CONTROLLING ELECTRIC POWER

BACKGROUND OF THE INVENTION

1. Field of the Invention

The present invention relates to a semiconductor device for controlling electric power, and more specifically to a semiconductor comprising a thyrister and a bi-polar transistor, or an IGBT (Insulated Gate Bi-polar Transistor) and MOS (Metal-Oxide-Silicon), forming a half-bridge circuit structured vertically on one semiconductor chip.

2. Description of the Related Art

Conventionally, an H bridge circuit is used to control the clockwise/counterclockwise rotation of a motor. FIG. 1 shows a general view of an H bridge circuit. For example, a motor M operates in clockwise rotation when an electric current flows in the direction of arrow $J_1$, while it operates in counterclockwise rotation when an electric current flows in the direction of arrow $J_2$.

The H bridge circuit is formed by a plurality of semiconductor chips each comprising a transistor and being connected to others via lines.

In this case, a small-size apparatus can be realized if a plurality of transistors forming a half-bridge circuit, that is, a half of an H bridge, can be integrated into one semiconductor chip. At this time, it is optimal to form a half-bridge circuit with high-performance vertically-structured transistors in which an electric current flows through a semiconductor substrate. However, it is very difficult to form a half-bridge circuit as one semiconductor chip because the transistors forming the upper and lower arms must be electrically separated from one another.

FIG. 2 shows a conventional commonly-used half-bridge circuit. FIG. 2A shows an example of the general configuration of the circuit, while FIG. 2B shows an equivalent circuit.

As shown in FIG. 2A, the conventional half-bridge circuit comprises a semiconductor chip 71 having a vertical type pnp transistor, a semiconductor chip 72 having a vertical type npn transistor, and a semiconductor chip 73 having a control IC, each being mounted on a substrate 74.

As shown in FIG. 2B, an output of the half-bridge is obtained at the connection point between the collector of the pnp transistor, that is, an upper arm, and the collector of the npn transistor, that is, a lower arm.

FIG. 3A shows a sectional view of the internal structure of the semiconductor device having a half-bridge circuit comprising two bi-polar transistors on one semiconductor chip. FIG. 3B shows an equivalent circuit.

As shown in FIG. 3A, an $n^-$-type area 82 is formed on one area of an $n^+$-type semiconductor substrate 81, a $p^+$-type area 83 is formed on the $n^-$-type area 82, and an $n^+$-type area 84 is formed on the $p^+$-type area 83.

On the other hand, an $n^-$-type area 86 is formed on the other area of the $n^+$-type semiconductor substrate 81 and isolated from the $n^-$-type area 82 by a p-type isolation area 85. $p^+$-type areas 87, 88, and 89, and an $n^+$-type area 90 are formed over the $n^-$-type area 86.

The above described $n^+$-type area 81, the $p^+$-type area 83, and the $n^+$-type area 84 are respectively a collector area, a base area, and an emitter area of the vertically-structured npn transistor. A collector terminal $C_V$ is connected to the reverse surface of the $n^+$-type area 81, a base terminal $B_V$ is connected to the top surface of the $p^+$-type area 83, and an emitter terminal $E_V$ is connected to the top surface of the $n^+$-type area 84. A ground terminal $T_G$ is connected to the p-type isolation area 85 and to the emitter terminal $E_V$, whereby the npn transistor is emitter-grounded.

The above described $p^+$-type areas 87 and 88, $n^+$-type area 90, and $p^+$-type area 89 respectively function as a collector area, a base area, and an emitter area of the horizontally structured pnp transistor. Additionally, a collector terminal $C_L$ is connected to the top surface of the $p^+$-type areas 87 and 88, a base terminal $B_L$ is connected to the top surface of the $n^+$-type area 90, and an emitter terminal $E_L$ is connected to the top surface of the $p^+$-type area 89. The collector terminal $C_V$ of the npn transistor is connected to the collector terminal $C_L$ of the pnp transistor, and a half-bridge output terminal $T_H$ is connected to the connection point.

In an equivalent circuit shown in FIG. 3B, the pnp transistor is an upper arm of a half-bridge circuit and formed as a horizontally structured element, and the npn transistor is a lower arm of a half-bridge circuit and formed as a vertically-structured element. Thus, an output of the half-bridge is obtained through the terminal $T_H$ extended from the connection point of the collector terminals $C_V$ and $C_L$.

As described above, when a half-bridge circuit is formed such that two transistors are connected to one semiconductor chip, the transistor of either the upper or the lower arm is a horizontally structured element. In the example shown in FIG. 3, the pnp transistor is an upper arm and a horizontally structured element.

In the thus structured semiconductor device, a control circuit (not shown in FIG. 3) can be conveniently integrated as a single semiconductor chip. However, there is a problem in that the size of the semiconductor chip becomes large depending on the size of the horizontally-structured transistor. Furthermore, a layer for electrically isolating a vertically-structured element from a horizontally structured element must be provided, which counteracts the realization of a smaller size semiconductor chip.

Generally, a horizontally structured transistor in which an electric current flows just beneath the surface of the semiconductor substrate is considerably inferior both in current amplification factor and current capacity to a vertically-structured transistor in which an electric current flows through the semiconductor substrate. Therefore, the performance of the entire semiconductor device comprising the above described half-bridge circuit is determined by an inferior horizontally structured element, resulting in performance reduction.. Accordingly, prior to the present invention effective merit cannot be expected from integrating a half-bridge circuit with two transistors on a single semiconductor chip.

SUMMARY OF THE INVENTION

The present invention has been developed based on the above described background, and aims at forming a small-size semiconductor device with the performance secured by integrating a half-bridge circuit as a single semiconductor chip.

That is, according to a first aspect of the present invention, there is provided a half-bridge circuit on a single semiconductor substrate, one of the two elements comprising a vertically-structured thyrister, and the other comprising a vertically-structured bi-polar transistor. The half-bridge circuit has a common area shared between a primary-conductor-type cathode area of the thyrister and a primary conductor type collector area of the bi-polar transistor.

The half-bridge circuit also has a first primary-conductor-type isolation area formed between the secondary-conductor-type intermediate layer of the thyrister and the primary,conductor-type common area.

Also, the half-bridge circuit has a second primary-conductor-type isolation area formed in the first isolation area between the secondary-conductor-type intermediate layer of the thyrister and a secondary-conductor-type base area of the bi-polar transistor.

With the above described configuration, an output of the half-bridge circuit is obtained from the common Therefore, the present invention realizes a high area-efficiency based Ion its vertical structure, requires no layers for electrically isolating an upper arm from a lower arm, uses a small-size semiconductor chip, and consequently realizes cost reduction. Furthermore, the vertical structure greatly improves the current amplification factor and current capacity, thereby realizing high efficiency in the capabilities of the upper and lower arms.

Since the present invention forms an isolation area between the intermediate layer area and the common area of the thyrister and between the intermediate layer area of the thyrister and the base area of the bi-polar transistor, it suppresses a leakage current generated by an incidental pnp structure or an incidental npn structure.

According to a second aspect of the present invention, a half-bridge circuit is integrated as a single semiconductor and comprises an upper arm of a vertically-structured p-channel IGBT and a lower arm of a vertically-structured n-channel MOS. It has an n-type common area between the n-collector area of the p-channel IGBT and the drain area of the channel MOS.

It also has a first n-type isolation area formed between the p-base area of the p-channel IGBT and the n-type common area.

In addition, it has a second n-type isolation area formed in the first isolation area between the p-base area of the p-channel IGBT and the p-type body of the n-channel MOS.

Thus, an output of the half-bridge is obtained from the above described common area.

Furthermore, according to a third aspect of the present invention, a half-bridge circuit is integrated as a single semiconductor and comprises an upper arm of a vertically-structured p-channel MOS and a lower arm of a vertically-structured n-channel IGBT.

It also has a p-type common area between the drain area of the p-channel MOS and the p-emitter area of the n-channel IGBT.

In addition, it has a first p-type isolation area formed between the n-base area of the n-channel IGBT and the p-type common area.

Also, it has a second p-type isolation area formed in the first isolation area between the n-type body of the p-channel MOS and the n-base area of the n-channel IGBT.

Thus, an output of the half-bridge is obtained from the common area.

Consequently, the second and third aspects as well as the first aspect of the present invention use a small-size semiconductor and realize effective cost reduction. They also improve the current amplification factor and current capacity, and yield high efficiency in the capabilities of the upper and lower arms.

According to the second aspect of the present invention, the circuit comprises an isolation area formed between the p-base area of the p-channel IGBT and the n-type common area, and an isolation area formed between the p-base area of the p-channel IGBT and the p-type body of the n-channel MOS.

Furthermore, according to the third aspect of the present invention, the circuit comprises an isolation area formed between the n-base area of the n-channel IGBT and the p-type common area, and an isolation area formed between the n-type body of the p-channel MOS and the n-base area of the n-channel IGBT.

Consequently, the second and third aspects as well as the first aspect of the present invention suppress a leakage current generated by an incidental pnp structure or an incidental npn structure.

BRIEF DESCRIPTION OF THE DRAWINGS

Other objects and features of the present invention can be easily recognized by referring to the attached drawings and the descriptions of the preferred embodiments of the present invention.

FIG. 2A shows an example of the general configuration of the circuit, and FIG. 2B shows an equivalent circuit;

FIG. 5A shows the configuration when the upper arm is on and the lower arm is off, and FIG. 5B shows the configuration when the upper arm is off and the lower arm is on;

FIG. 10A shows a sectional view of the internal structure of the semiconductor device, and FIG. 10B shows an equivalent circuit;

FIG. 11A shows a sectional view of the internal structure of the semiconductor device, and FIG. 11B shows an equivalent circuit;

DESCRIPTION OF THE PREFERRED EMBODIMENTS

Figure 1:
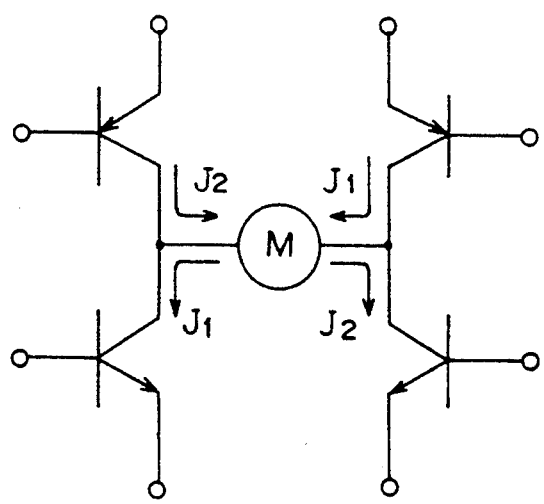
FIG. 1 shows the general view of an H-bridge circuit.
Figure 2A:
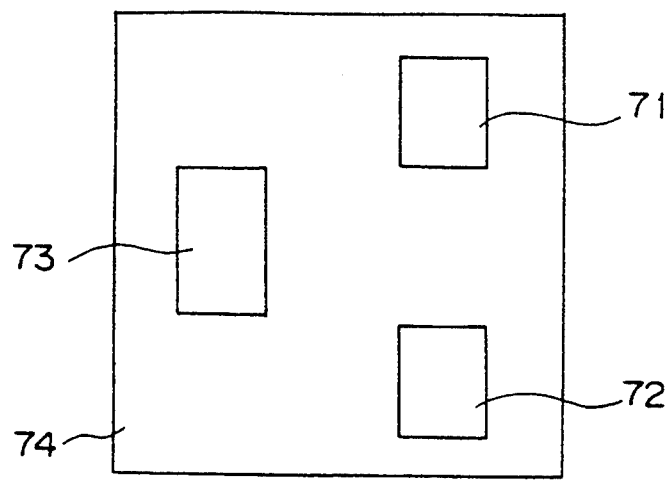
FIGS. 2A and 2B show a conventional commonly-used half-bridge circuit.
Figure 2B:
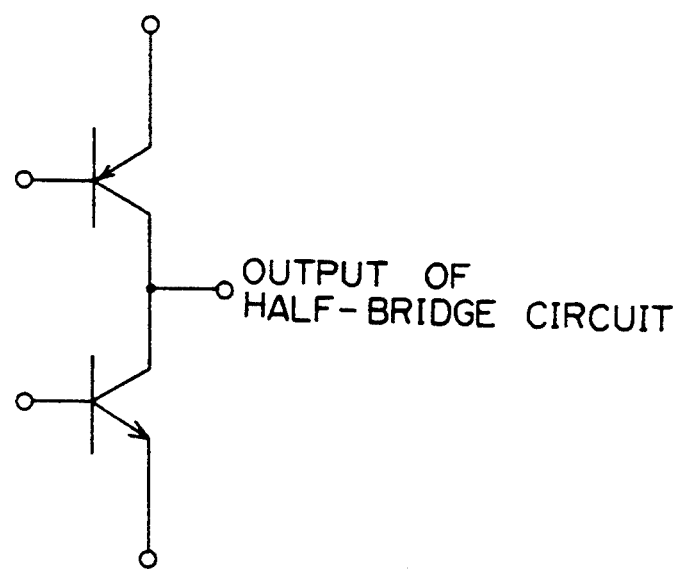
Figure 3A:
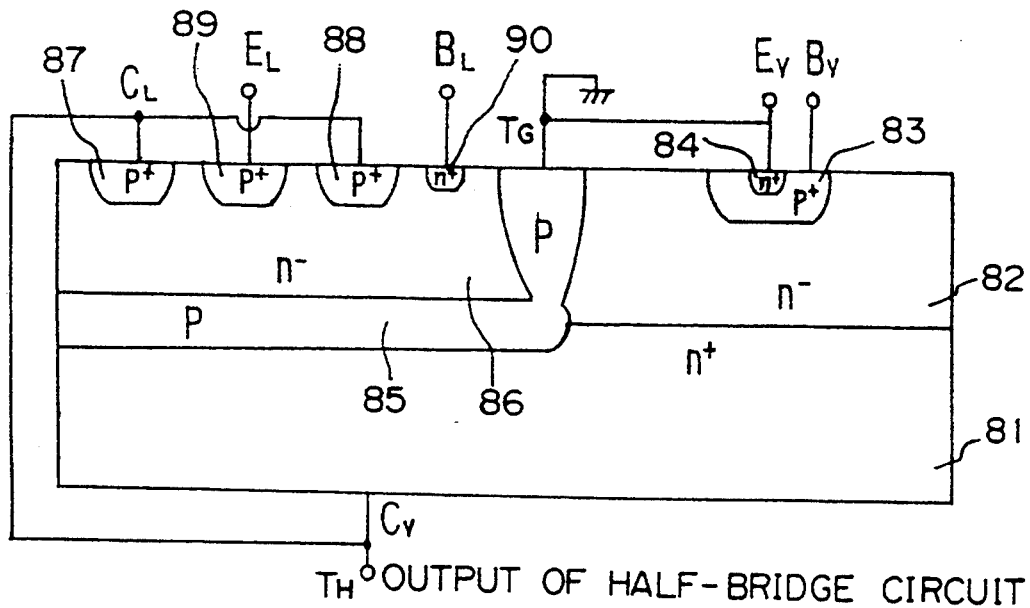
FIG. 3A shows a sectional view of the internal structure of a half-bridge circuit comprising two bi-polar transistors integrated as a single semiconductor.
Figure 3B:
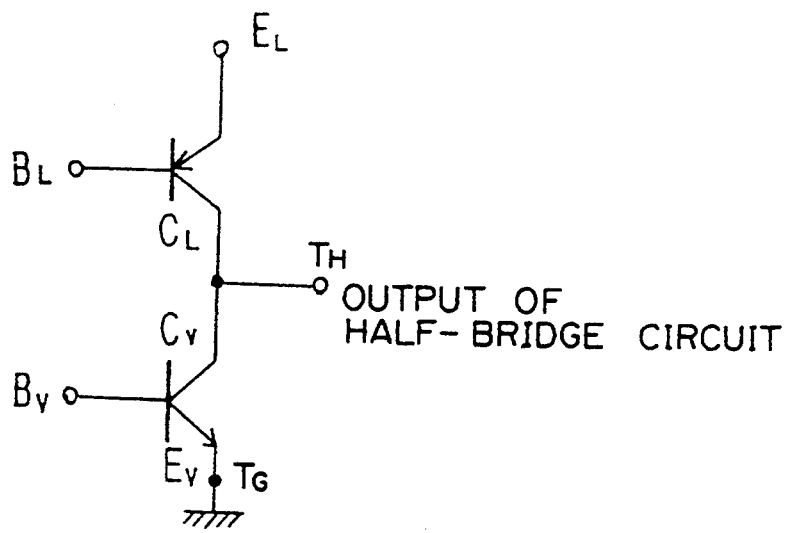
FIG. 3B shows an equivalent circuit.
Figure 4A:
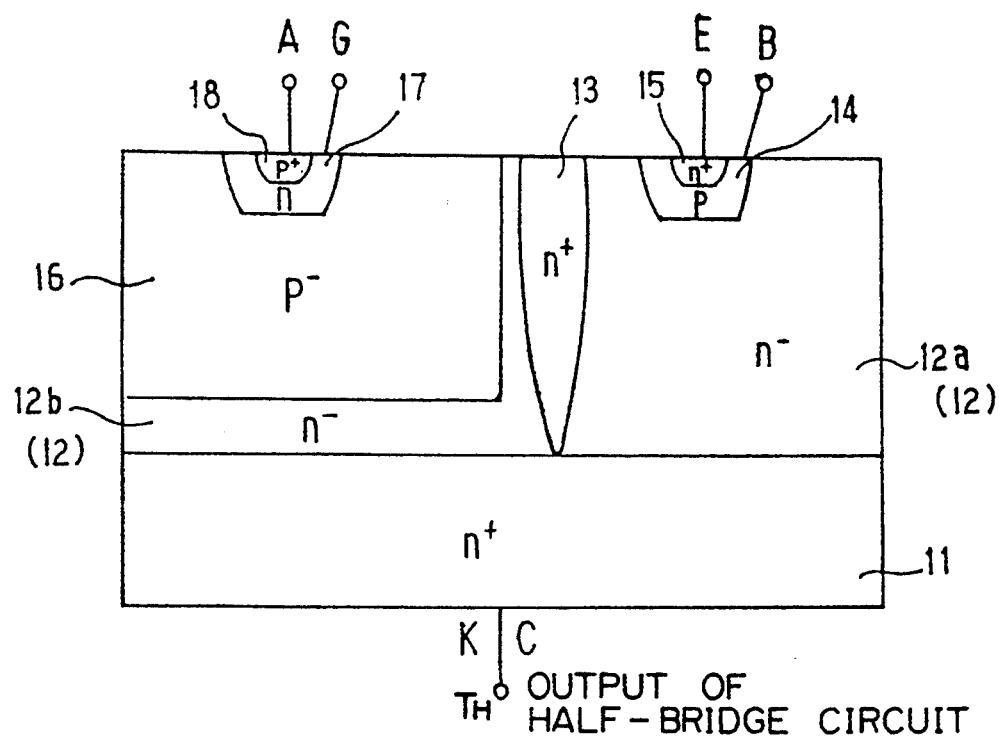
FIG. 4A shows a sectional view of the internal structure of the semiconductor device according to the first embodiment of the present invention.
Figure 4B:
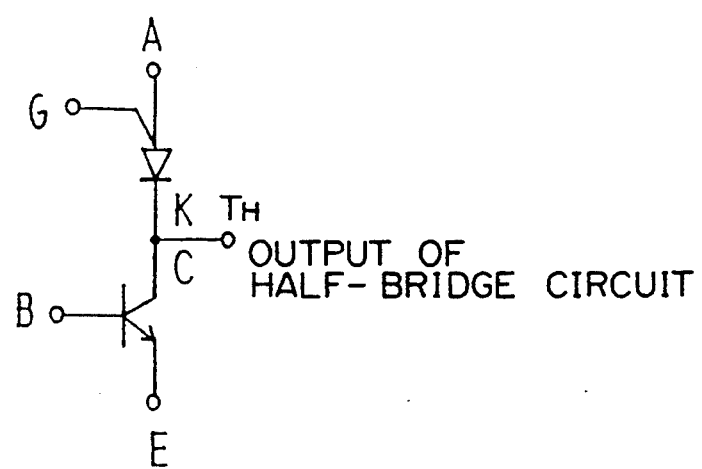
FIG. 4B shows an equivalent circuit.

FIG. 4A shows a sectional view of the internal structure of the semiconductor device according to the first embodiment of the present invention, and FIG. 4B shows an equivalent circuit.

As shown in FIG. 4A, an epitaxial growth is applied over an $n^+$-type substrate 11 such as silicon, etc. to form an $n^-$-type area 12. The $n^-$-type area 12 is divided into two $n^-$-type areas 12a and 12b by an $n^+$-type area 13, that is, an isolation layer. A predetermined depth of a p-type area 14 is applied over the $n^-$-type area 12a, and a predetermined depth, not so deep as the p-type area 14, of an $n^+$-type area 15 is applied over the p-type area 14.

A $p^-$-type area 16 is applied over the $n^-$-type area 12b. A predetermined depth of an n-type area 17 is applied over the $p^-$-type area 16, and a predetermined depth, not so deep as the n-type area 17, of a $p^+$-type area 18 is applied over the n-type area 17.

The $n^+$-type area 11, the p-type area 14, and the $n^+$-type area 15 are, respectively, a collector area, a base area, and an emitter area of a vertically-structured npn transistor. A base terminal B is connected to the top surface of the p-type area 14, and an emitter terminal E is connected to the top surface of the $n^+$-type area 15.

The $n^+$-type area 11, the n-type area 17, and the $p^+$-type area 18 are, respectively, a cathode area, a gate area, and an anode area of a vertically-structured pnpn thyrister, and the $p^-$-type area 16 is an intermediate layer. A gate terminal G is connected to the top surface of the n-type area 17, and an anode terminal A is connected to the top surface of the $p^+$-type area 18. The $n^+$-type area 11 is shared by the npn transistor and the pnpn thyrister and functions as a common collector/cathode area. From the reverse surface of the $n^+$-type area 11, a common terminal $T_H$ is connected for use as a collector terminal C, a cathode terminal K, and a half-bridge output terminal.

In the equivalent circuit shown in FIG. 4B, the upper arm is formed by a vertically-structured pnpn thyrister, while the lower arm is formed by a vertically-structured npn transistor. The output of the half-bridge circuit is obtained from a common terminal $T_H$ extended from the connection point between the collector terminal C and the cathode terminal K.

Next, the operation of isolating the thyrister from the bi-polar transistor according to the first embodiment is explained as follows.

Assume that, in the equivalent circuit shown in FIG. 4B, the pnpn thyrister is an upper arm and in an "on" state, and the npn transistor is a lower arm and in an "off" state. At this time, the potential at the connection point of the thyrister pnpn is maintained at the level of the ON voltage (about 0.6V) of each connection point. On the other hand, the npn transistor is in an "off" state, and the base potential is lowered.

Figure 5A:
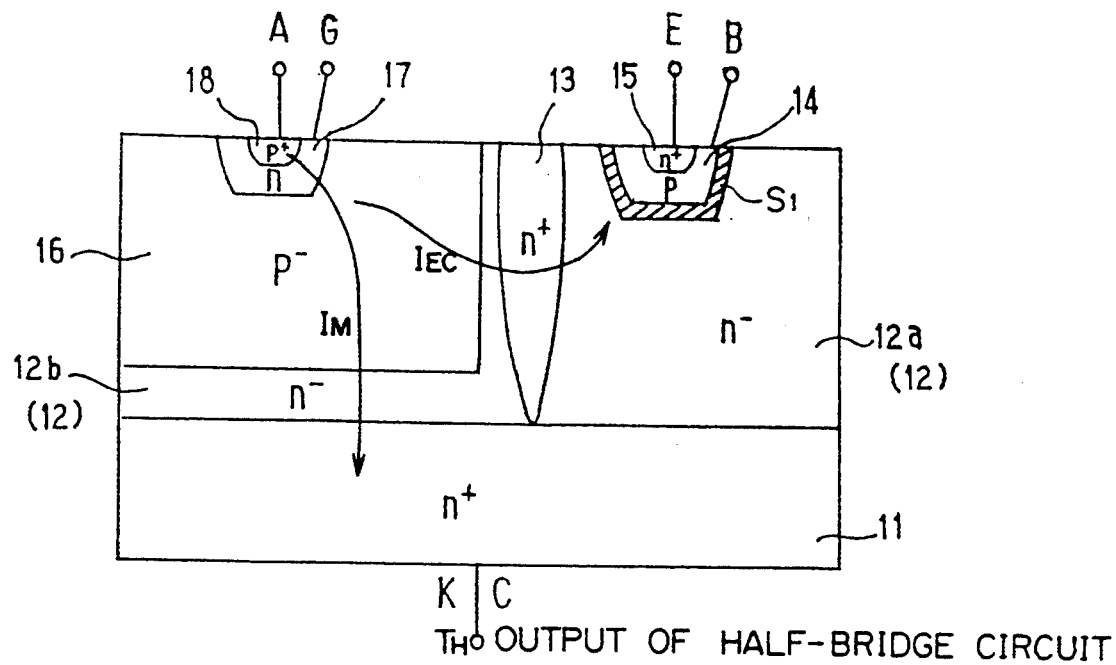
FIGS. 5A and 5B show that the upper arm and the lower arm are electrically isolated from each other in the semiconductor device shown in FIGS. 4A and 4B.

Accordingly, as shown in FIG. 5A, the potential of the collector area 11 of the npn transistor rises to a high level in accordance with the ON potential of the cathode area 11, that is, the common area of the pnpn thyrister. Therefore, the n-type area 12a becomes higher in potentials than the p-type area 14, that is, the base area of the npn transistor. Consequently, the pnpn thyrister as an upper arm is electrically separated from the npn transistor, is, a lower arm by a depletion layer $S_1$ (indicated by diagonal shading) between the collector and the base of the npn transistor formed in the $n^-$-type area 12a.

Next, assume that in the equivalent circuit shown in FIG. 4B, the pnpn thyrister is an upper arm and in an "off" state, and the npn transistor is a lower arm and in an "on" state. At this time, the collector potential of the npn transistor is lowered. On the other hand, the pnpn thyrister is in an "off" state, and the cathode potential is lowered.

Figure 5B:
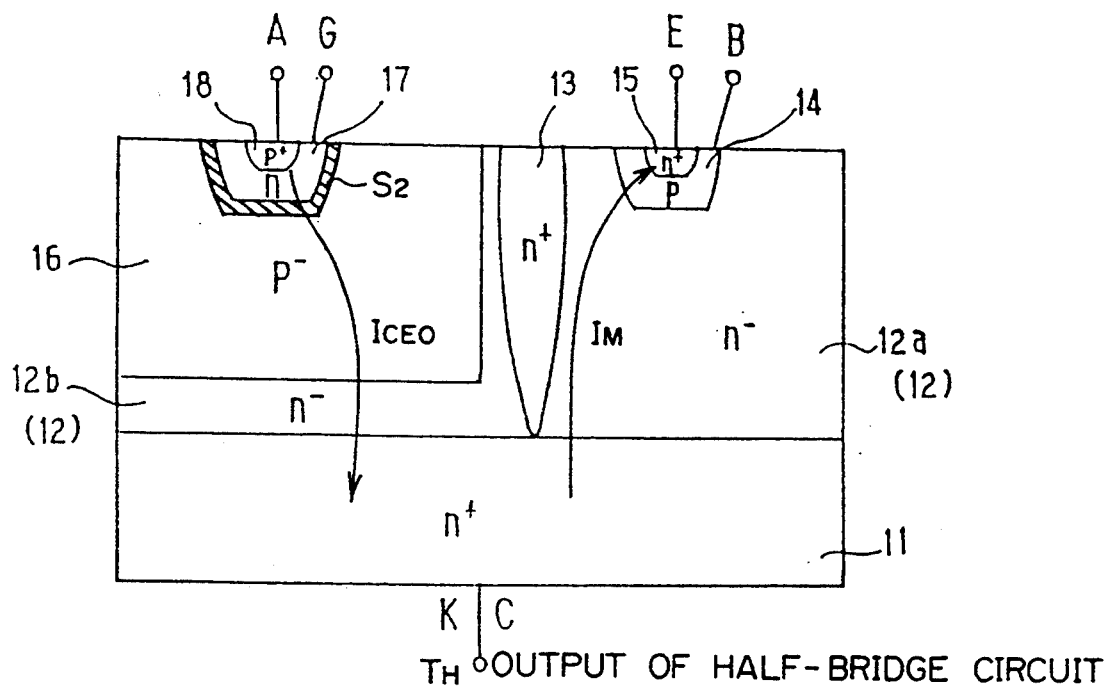

Therefore, in FIG. 5B, the potential of the gate area 17 of the pnpn thyrister is raised to a high level, and the n-type area 17 becomes higher in potential than the $p^-$-type area 16. Accordingly, a depletion layer $S_2$ (indicated by diagonal shading) between the gate and the cathode of the pnpn thyrister formed in the $p^-$-type area 16 electrically isolates the pnpn thyrister, the upper arm, from the npn transistor, the lower arm.

Figure 6:
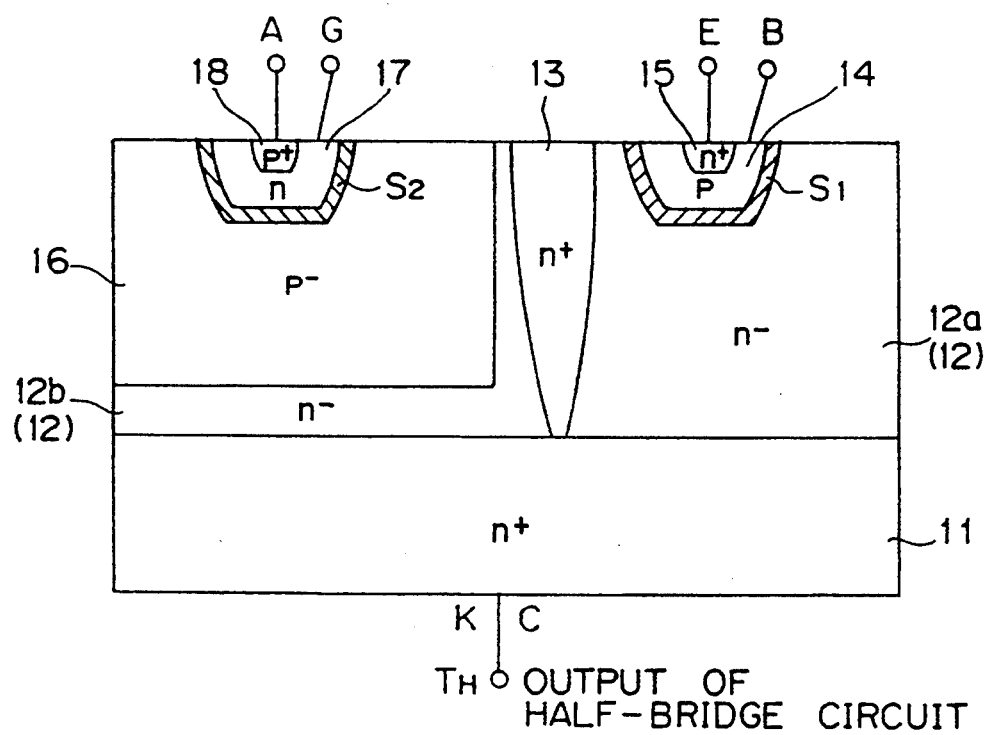
FIG. 6 shows that the upper arm and the lower arm are electrically isolated from each other in the semiconductor device shown in FIGS. 4A and 4B, wherein both arms are off.

If the pnpn thyrister is an upper arm, and the npn transistor is a lower arm, both being in an "off" state, then the depletion layers $S_1$ and $S_2$ between the base and the collector of the npn transistor and between the gate and the cathode of the pnpn transistor electrically isolate the upper arm from the lower arm as shown in FIG. 6.

Next, the operation of the $n^+$-type area 13 and the $n^-$-type area 12b in the above described structure is explained as follows.

First, assume that, as shown in FIG. 5A, the pnpn thyrister is an upper arm and in an "on" state, and the npn transistor is a lower arm and in an "off" state. At this time, the main current $I_M$ flows as shown in FIG. 5A. Unless the $n^+$-type area 13 is provided, an incidental pnp structure is formed between the $p^-$-type area 16 and the $n^-$-type area 12 of the pnpn thyrister, and the p-type area 14, that is, the base area of the npn transistor. In this case, a leakage current $I_{EC}$ can be generated. To prevent the problem, the $n^+$-type area 13 is provided as an isolation area, thereby suppressing the leakage current $I_{EC}$ and lowering the current amplification factor $\beta$ of the incidental pnp structure.

The provision of the $n^+$-type isolation area 13 generates a high density area, higher than the $n^-$-type area 12a, in the $n^-$-type area 12a, that is, the base area of the incidental pnp transistor. In this case, a carrier is regenerated in the $n^+$-type isolation area 13. Consequently, the leakage current $I_{EC}$ can be suppressed and the current amplification factor $\beta$ of the incidental pnp structure is lowered.

Assume that the npn transistor is a lower arm and in an "on" state, and the pnpn thyrister is an upper arm and in an "off" state as shown in FIG. 5B. At this time, the main current $I_M$ flows as shown in FIG. 5B. Unless the $n^-$-type area 12b is provided, an incidental npn structure is formed between the $n^+$-type semiconductor substrate 11, that is, the common collector cathode area, and the $p^-$-type area 16 of the pnpn thyrister, and the n-type area 17, that is, the gate area of the pnpn thyrister. Then, the leakage current $I_{CEO}$ flows through the structure. The $n^-$-type area 12b which is provided as an isolation area to prevent the problem, reduces the carrier injection efficiency from the $n^+$-type semiconductor substrate 11, that is, the common collector cathode area, and suppresses the leakage current $I_{CEO}$.

The provision of the $n^-$-type isolation area 12b generates a low density area, lower than the $n^+$-type substrate 11, on the $n^+$-type substrate 11 corresponding to the emitter area of the incidental npn transistor. This means that the density of the emitter area of the incidental npn transistor is lowered, resulting in the reduction of the emitter injection efficiency and the suppression of the leakage current $I_{CEO}$.

Figure 7:
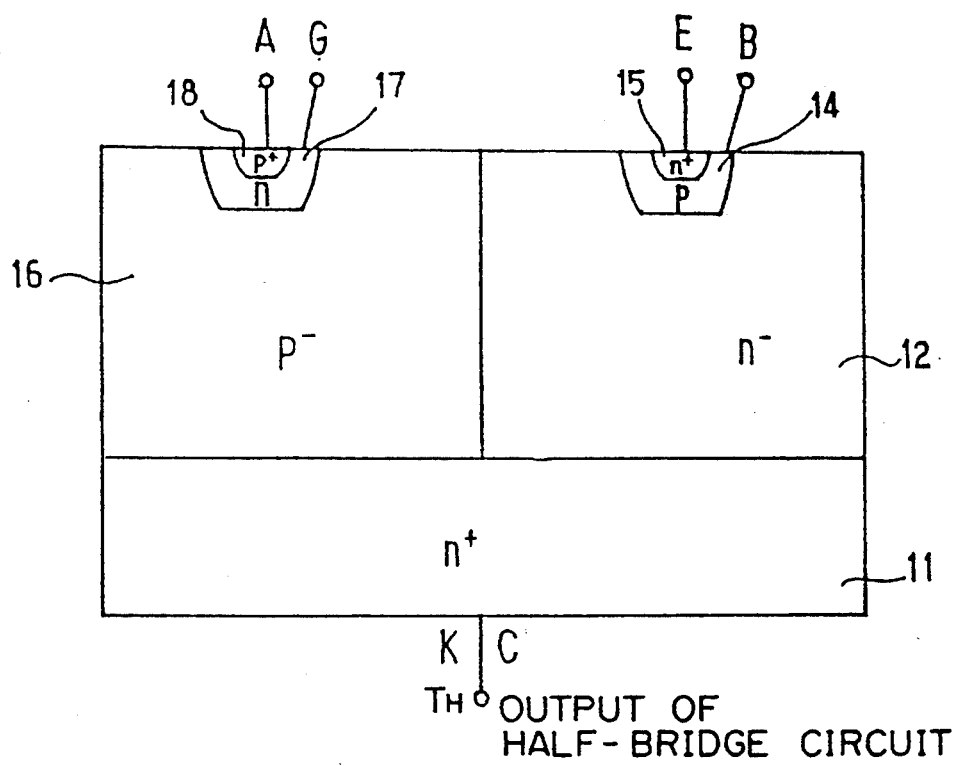
FIG. 7 shows a sectional view of the internal structure of the semiconductor device when no areas for preventing leakage current are formed in the semiconductor device shown in FIG. 4.

FIG. 7 shows a sectional view of the internal structure of the semiconductor device according to the first embodiment when an area for suppressing the leakage current is not formed. In this case, $p^-$-type area 16 is formed in series over the $n^+$-type semiconductor substrate 11.

The $n^-$-type area 12b is formed in the process of forming the $n^-$-type area 12 over the $n^+$-type semiconductor substrate 11. The $n^+$-type area 13 can be easily formed by being diffused over the $n^-$-type area 12 after it has been formed.

According to the first embodiment, the pnpn thyrister and the npn transistor are vertically structured to integrate a half-bridge circuit on a single semiconductor chip. In this case, the upper arm and the lower arm are not horizontally structured and provide excellent in area efficiency although a control circuit cannot be loaded. Since no layers for electrically isolating the upper arm from the lower arm are required, the semiconductor can be small enough and the production cost can be reduced. Furthermore, since no arms are horizontally structured, the semiconductor device is not subject to performance deterioration in current amplification factor or current capacity. Thus, the capabilities of the upper and lower arms can be made most use of. Additionally, leakage current between the upper arm and the lower arm is suppressed.

Figure 8:
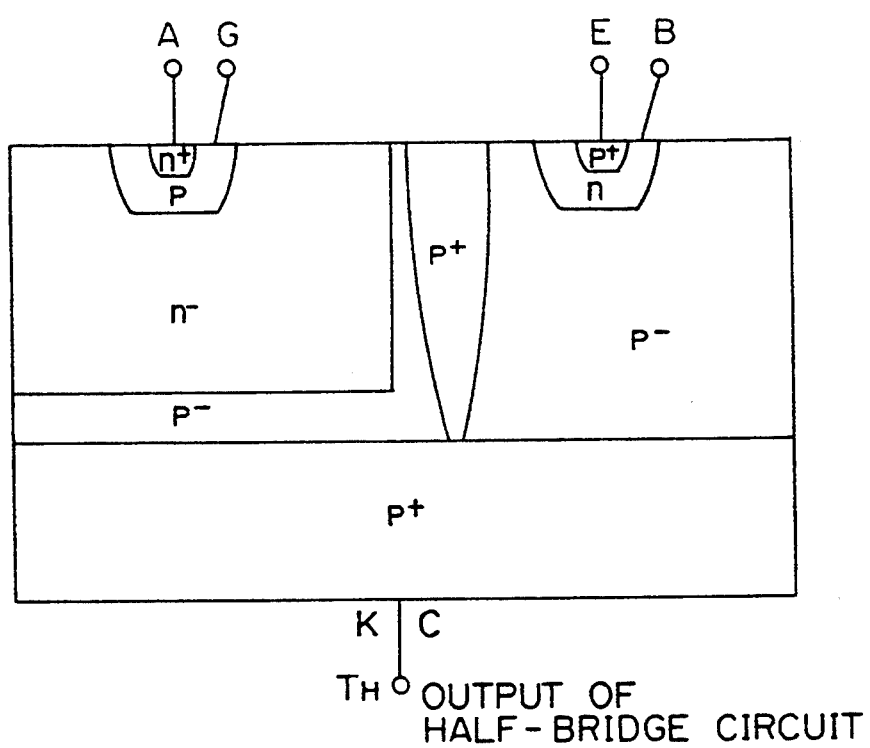
FIG. 8 shows a sectional view of the internal structure of the semiconductor device in which the conductor types are reverse to the first embodiment.

Although a more detailed explanation is omitted here, the present invention also realizes the semiconductor device shown in FIG. 8 in which the conductor types are reverse that of the first embodiment. Additionally, an isolation area for suppressing the leakage current is not limited to the form described above, but can have another shape.

Next, the second embodiment of the present invention is explained.

Figure 9A:
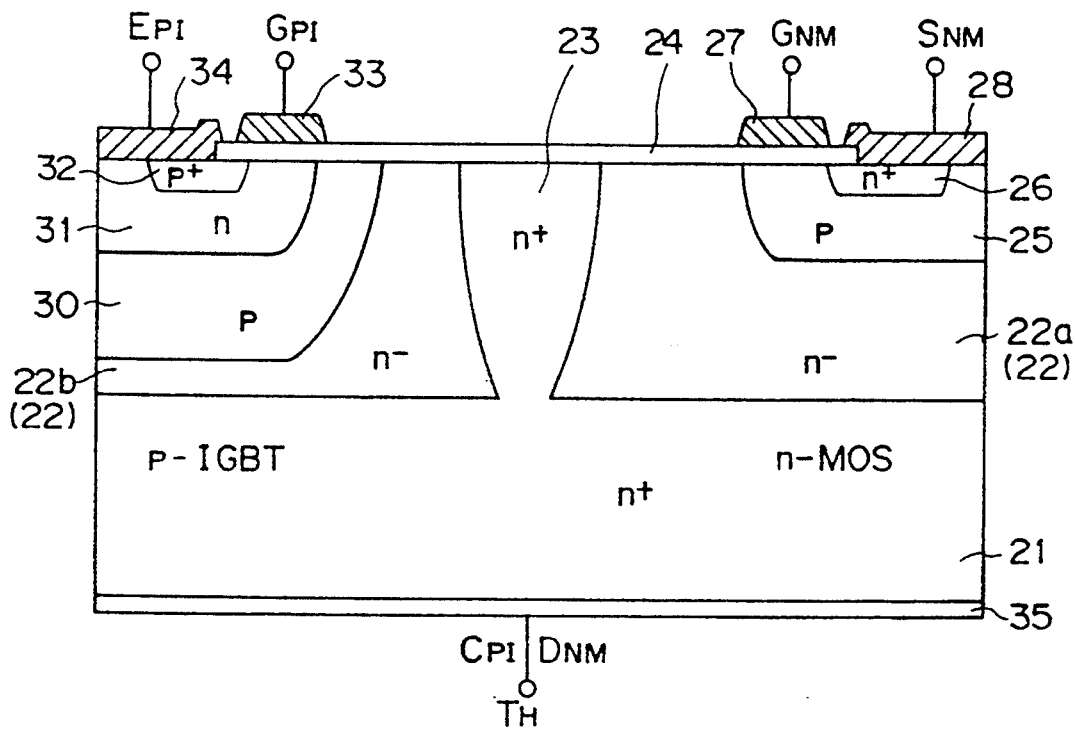
FIG. 9A shows a sectional view of the internal structure of the semiconductor device according to the second embodiment of the present invention.
Figure 9B:
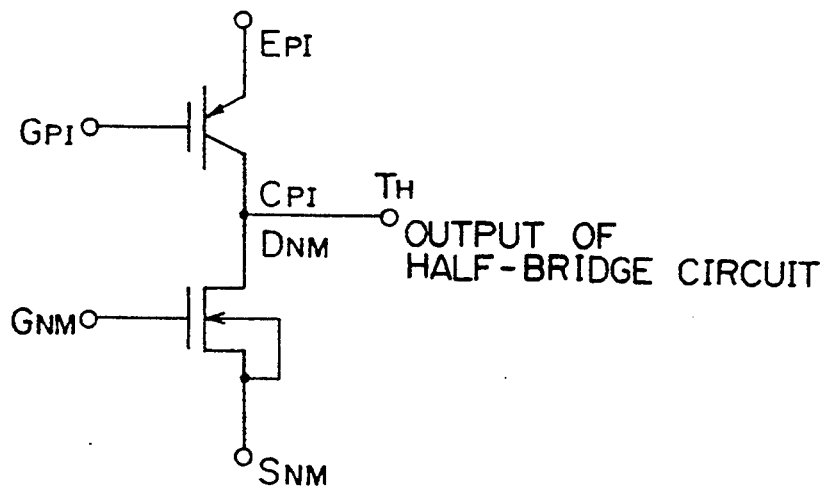
FIG. 9B shows an equivalent circuits.

FIG. 9A shows a sectional view of the internal structure of the semiconductor device according to the second embodiment. FIG. 9B shows an equivalent circuit.

As shown in FIG. 9A, an $n^-$-type area 22 is formed by applying, for example, an epitaxial growth over an $n^+$-type structure 21 such as silicon, etc. The $n^-$-type area 22 is divided into two $n^-$-type area 22a and 22b by an $n^+$-type area 23, providing an isolation layer.

Then, a silicon oxide film 24 is formed with its surface oxidized over the $n^+$-type substrate 21 incorporating the $n^-$-type area 22 and the $n^+$-type area 23.

A p-type area 25 is formed, for example, by being diffused over the $n^-$-type area 22a. Then, the predetermined depth of an $n^+$-type area 26 is formed over the p-type area 25.

That is, a vertically-structured n-channel MOS (hereinafter referred to as an n-MOS) is formed on one area of the $n^+$-type substrate 21, comprising the p-type area 25 as a body, the $n^+$-type area 26 as a source area, and the $n^+$-type substrate 21 as a drain area.

Then, a gate electrode 27 is formed on the silicon oxide film 24 over the p-type area 25 with the contact of the silicon oxide film 24 used as a gate oxide film according to, for example, a vacuum deposition method, etc. using aluminum.

Additionally, a source electrode 28 is formed well over the $n^+$-type area 26 exposed from the opening of the silicon oxide film 24 according to, for example, a vacuum deposition method, etc. using aluminum as described above.

Furthermore, a p-type area 30 is formed, for example, by being diffused over the $n^-$-type area 22b on the other area of the $n^+$-type substrate 21. Then, a predetermined depth of an n-type area 31 is formed over the p-type area 30, and a predetermined depth of a $p^+$-type area 32 is formed over the n-type area 31.

That is, a vertically-structured p-channel IGBT (hereinafter referred to as a p-IGBT) is formed on the other area of the $n^+$-type substrate 21, comprising the $n^+$-type substrate 21 as an n collector area, the p-type area 30 as a p base area, the n-type area 31 as an n base area, and the $p^+$-type area 32 as a p emitter area. The $n^+$-type substrate 21 is a drain/collector common area used as a drain area of the n-MOS and an n collector area of the p-IGBT.

Then, a gate electrode 33 is formed on the silicon oxide film 24 over the n-type area 31 with the contact of the silicon oxide film 24 used as a gate oxide film according to, for example, a vacuum deposition method, etc. using aluminum as described above.

Additionally, an emitter electrode 34 is formed well over the $p^+$-type area 32 exposed from the opening of the silicon oxide film 24 according to, for example, a vacuum deposition method, etc. using aluminum as described above.

Furthermore, an electrode 35 is formed over the reverse surface of the $n^+$-type substrate 21 according to a vacuum deposition method, etc.. The electrode 35 is a drain electrode of the n-MOS and a collector electrode of the p-IGBT.

A gate terminal $G_{NM}$ and a source terminal $S_{NM}$ are respectively connected to the gate electrode 27 and the source electrode 28. Likewise, a gate terminal $G_{PI}$ and an emitter terminal $E_{PI}$ are respectively connected to the gate electrode 33 and the emitter electrode 34. Furthermore, a common terminal $T_H$ to be used as a drain terminal $D_{MN}$, collector terminal $C_{PI}$, and half-bridge output terminal is connected to the electrode 35.

As indicated by the equivalent circuit shown in FIG. 9B, the upper arm is formed by a vertically-structured p-IGBT, and the lower arm is formed by a vertically-structured n-MOS. Then, an output of the half-bridge circuit can be obtained through the common terminal $T_H$ extended from the connection point between the drain terminal $D_{NM}$ and the collector terminal $C_{PI}$.

Next, according to the above described second embodiment, the operation of isolating the p-IGBT from the n-MOS is explained.

Figure 10A:
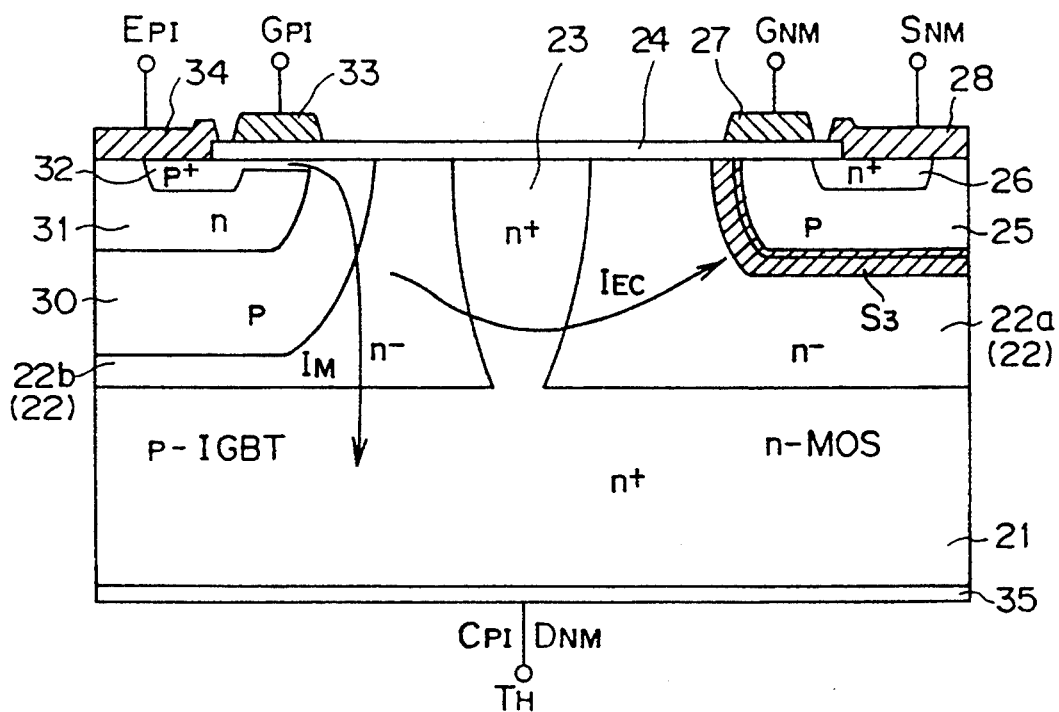
FIGS. 10A and 10B show that the upper and lower arms are electrically isolated from each other when the upper arm is on and the lower arm is off in the semiconductor device shown in FIG. 9.
Figure 10B:
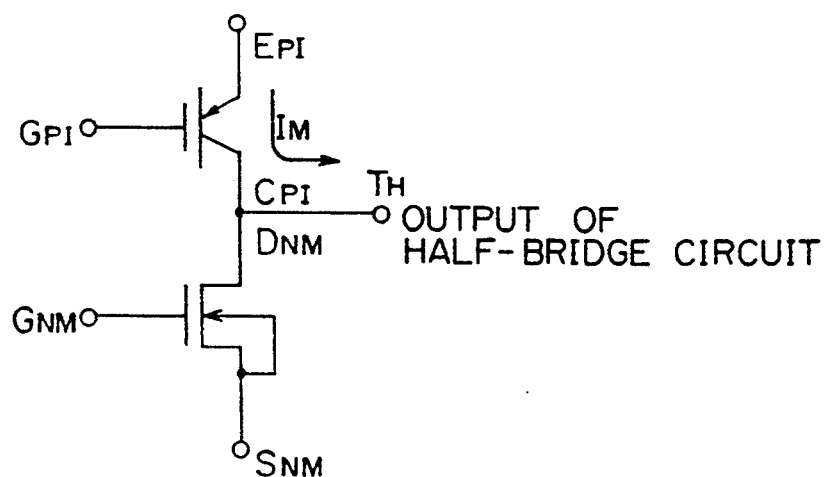

Assume that, in the equivalent circuit shown in FIG. 10B, the p-IGBT is an upper arm and in an "on" state, and the n-MOS is a lower arm and in an "off" state. At this time, since the n-MOS is in an "off" state, the gate potential is lowered, and the drain potential is at a high level because the p-IGBT is in an "on" state.

Accordingly, as shown in FIG. 10A, the n-type area 22a is higher in potential than the p-type area 25, that is, the body of the n-MOS. Therefore, a depletion layer $S_3$ (indicated by diagonal shading) extended mainly over the n-type area 22a is formed around the pn connection between the p-type area 25 and the n-type area 22a. Thus, the upper arm p-IGBT is electrically isolated from the lower arm n-MOS.

Figure 11A:
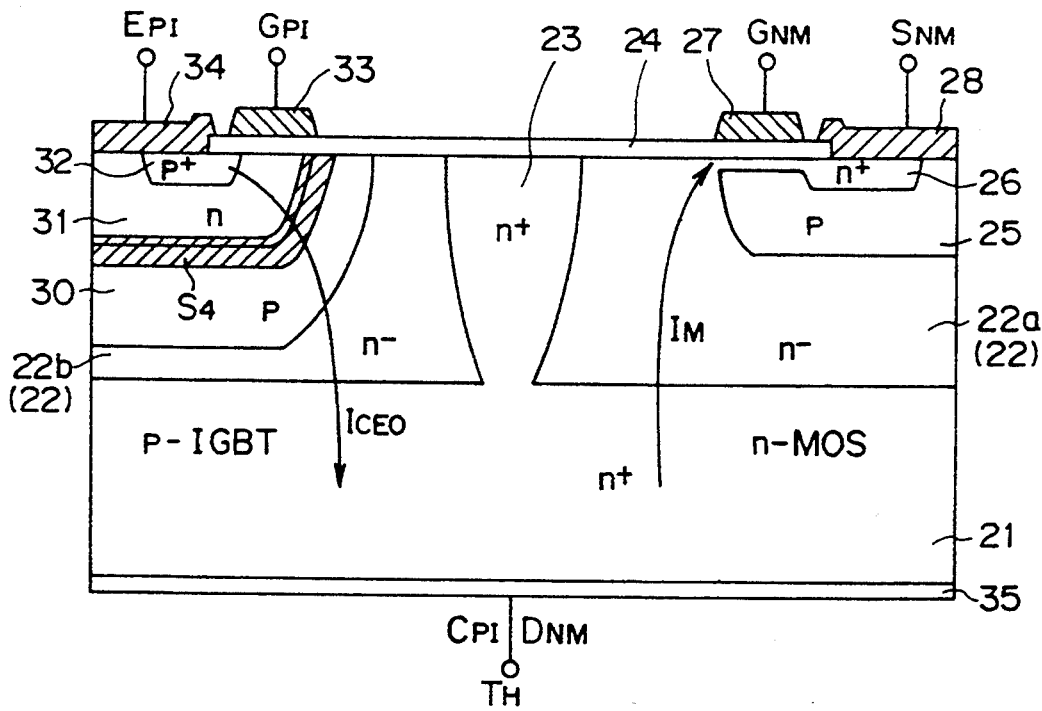
FIGS. 11A and 11B show that the upper and lower arms are electrically isolated from each other when the upper arm is off and the lower arm is on in the semiconductor device shown in FIG. 9.
Figure 11B:
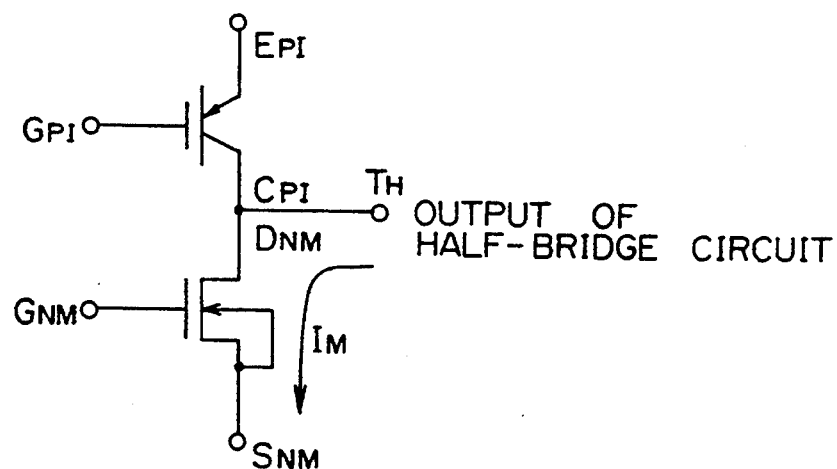

Assume that, in the equivalent circuit shown in FIG. 11B, the p-IGBT is an upper arm and in an "off" state, and the n-MOS is a lower arm and in an "on" state. At this time, since the n-MOS is in an "on" state, the drain potential is lowered. Since the p-IGBT is in an "off" state, the collector potential is also lowered.

Accordingly, as shown in FIG. 11A, the potential of the n-type area 31, that is, the n base area of the p-IGBT, is raised to a high level, and the n-type area 31 becomes higher in potential than the p-type area 30. Therefore, a depletion layer $S_4$ (indicated by diagonal shading) is formed around the pn connection between the p-type area 30 and the n-type type area 31. Thus, the upper arm p-IGBT is electrically isolated from the lower arm n-MOS.

Figure 12:
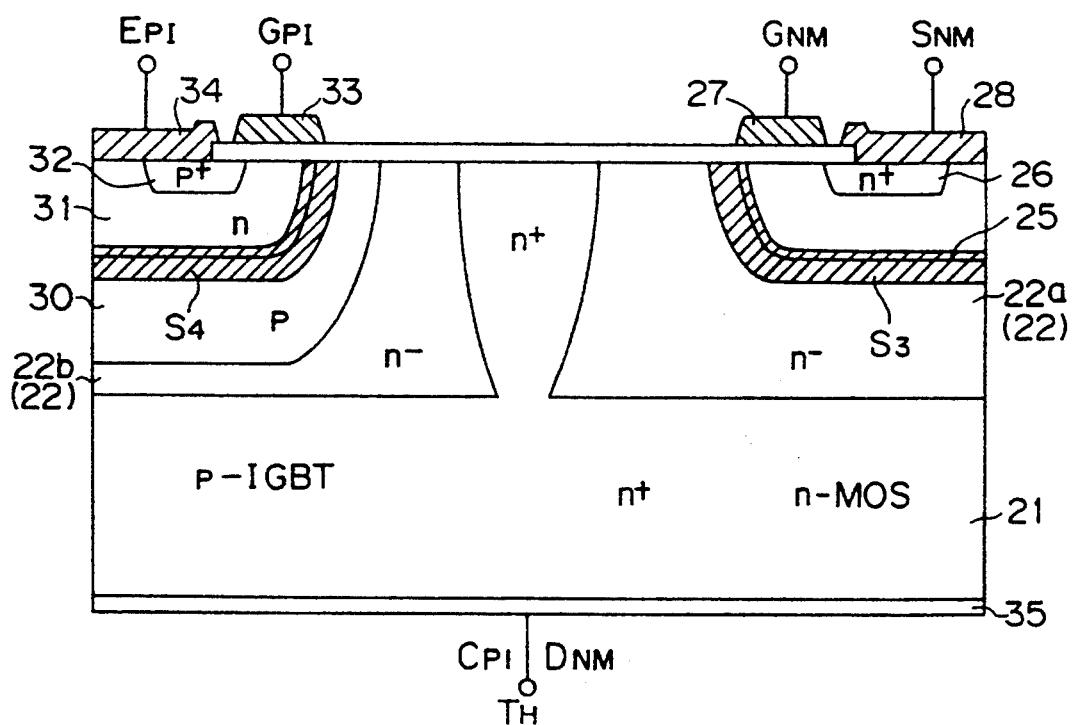
FIG. 12 shows a sectional view that the upper and lower arms are electrically isolated from each other when both upper and lower arms are off in the semiconductor device shown in FIG. 9.

If the upper arm p-IGBT and the lower arm n-MOS are "off", then the depletion layers $S_3$ and $S_4$ are formed between the gate and the drain of the n-MOS and between the n base and p base of the p-IGBT as shown in FIG. 12. Thus, the upper arm is electrically isolated from the lower arm.

Next, the operation of the $n^+$-type area 23 and the $n^-$-type area 22b in the above described structure is explained.

As shown in FIG. 10A, assume that the p-IGBT is an upper arm and in an "on" state, and the n-MOS is a lower arm and in an "off" state. At this time, the main current $I_M$ flows as shown in FIG. 10A. Unless the $n^+$-type area 23 is formed, an incidental pnp structure is formed between the p-type area 30 and the $n^-$-type area 22 of the p-IGBT, and the p-type area 25, that is, the body of the n-MOS. Thus, a leakage current $I_{EC}$ may flow through the structure. The $n^+$-type area 23 which is formed as an isolation area to solve the problem, suppresses the leakage current $I_{EC}$ which is not explained in detail here, and lowers the current amplification factor of the incidental pnp structure.

As shown in FIG. 11A, assume that the n-MOS is a lower arm and in an "on" state, and the p-IGBT is an upper arm and in an "off" state. At this time, the main current $I_M$ flows as shown in FIG. 11A. Unless the $n^-$-type area 22b is formed, an incidental npn structure is formed between the $n^+$-type substrate 21, that is, the common drain/n-collector area, and the p-type area 30, and the n-type area 31. Thus, a leakage current $I_{CEO}$ may flow through the structure. The $n^-$-type area 22b which is formed as an isolation area to solve the problem, reduces the injection efficiency of a carrier from the $n^+$-type substrate 21, that is, the common drain/-n collector, and suppresses the leakage current $I_{CEO}$ which is not explained in detail here.

The $n^-$-type area 22b is formed in the process of forming the $n^-$-type area 22 over the $n^+$-type substrate 21. The $n^+$-type area 23 can be easily formed, for example, by being diffused over the $n^-$-type area 22 after it has been formed.

Thus, according to the second embodiment, the p-IGBT and the n-MOS are vertically structured to integrate a half-bridge circuit on a single semiconductor chip. In this case, a control circuit comprising, for example, a CMOS (Complementary Metal-Oxide-Silicon) can be included as shown in FIG. 13.

Figure 13:
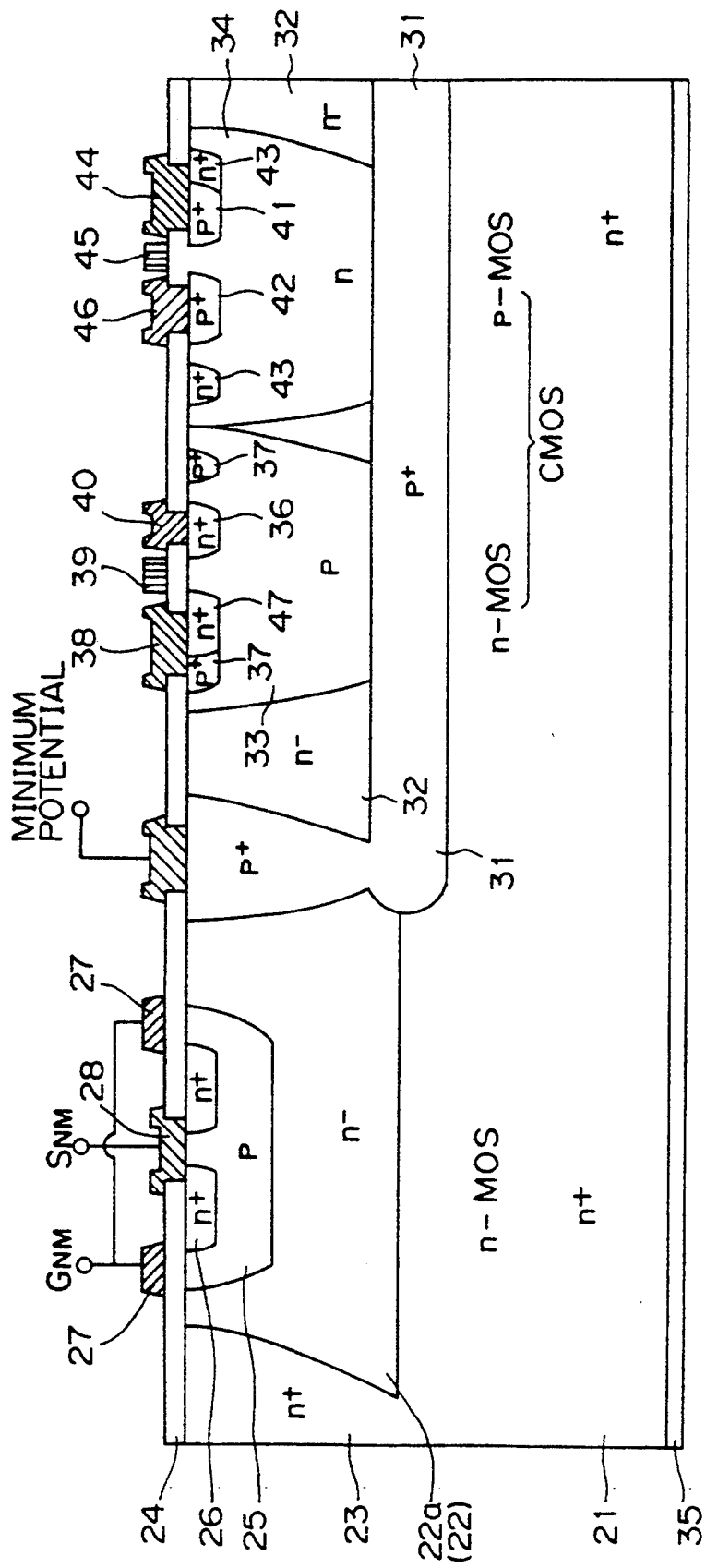
FIG. 13 shows a sectional view of the internal structure of the semiconductor device according to the second embodiment in which a control circuit can also be formed.

That is, as shown in FIG. 13, the CMOS control circuit comprises an n-MOS on a p well 33 and a p-MOS on a n well 34 in a $n^-$-type area 32 supplied with a minimum potential and formed as being isolated from the $n^+$-type substrate 21 by the $p^+$-type isolation area 31 on the right-hand area of the substrate 21, that is, the lower arm n-MOS. The n-MOS in the p well comprises an $n^+$-type source area 47, an $n^+$-type drain area 36, $p^+$-type channel stopper areas 37 surrounding the two areas 47 and 36, a source electrode 38, a gate electrode 39, and a drain electrode 40. The p-MOS in the n well comprises a $p^+$-type source area 41, a $p^+$-type drain area 42, $n^+$-type channel stopper areas 43 surrounding the two areas 41 and 42, a source electrode 44, a gate electrode 45, and a drain electrode 46.

Thus, according to the second embodiment as well as the first embodiment of the present invention, the upper and lower arms are not horizontally structured, and provide excellent area efficiency. Additionally, the present invention requires no specific layers for electrically isolating the upper arm from the lower arm, realizes a small semiconductor chip, and reduces production cost. Since the arms are not horizontally structured, the current amplification factor and the current capacity are not disadvantageously determined to reduce the performance of the whole device, and the maximum possible efficiency of the upper and lower arms can be successfully obtained. Furthermore, the leakage current can be suppressed between the upper and lower arms.

Additionally, since control circuits such as a CMOS circuit, etc. can be integrated on a single semiconductor chip, the present invention can greatly reduce the size and the cost of the whole device.

Furthermore, since both upper and lower arms incorporate voltage control elements, improved switching capabilities are realized, thereby reducing electricity consumption and enabling the CPU to directly drive the circuit according to the input through the TTL.

Next, the third embodiment of the present invention is explained.

Figure 14A:
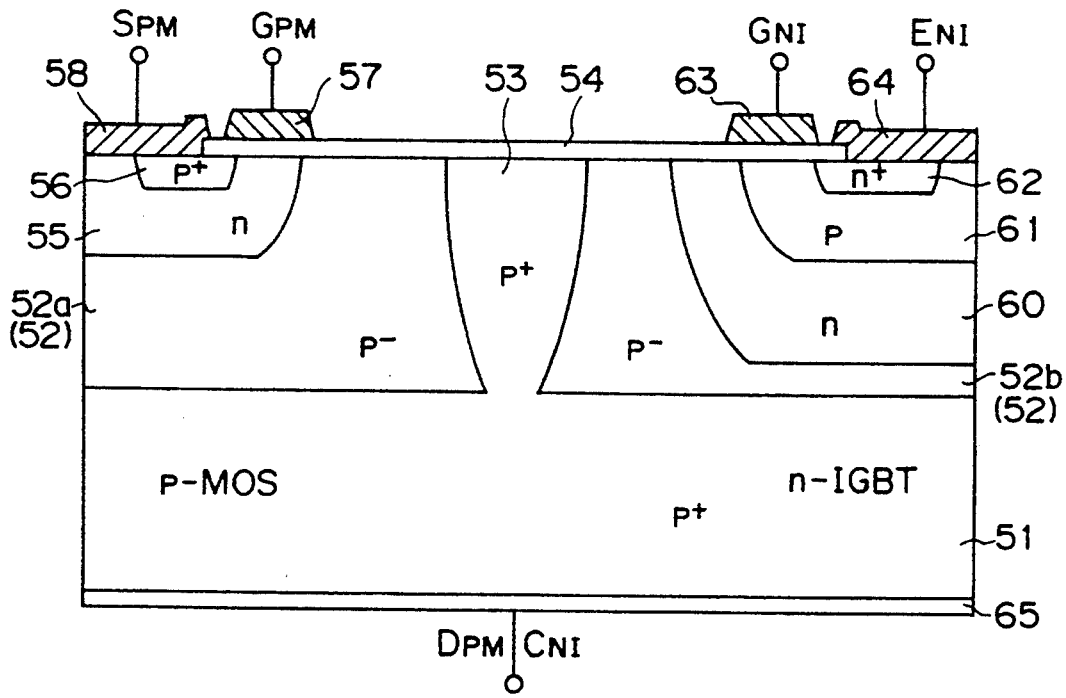
FIG. 14A shows a sectional view of the internal structure of the semiconductor device according to the third embodiment of the present invention.
Figure 14B:
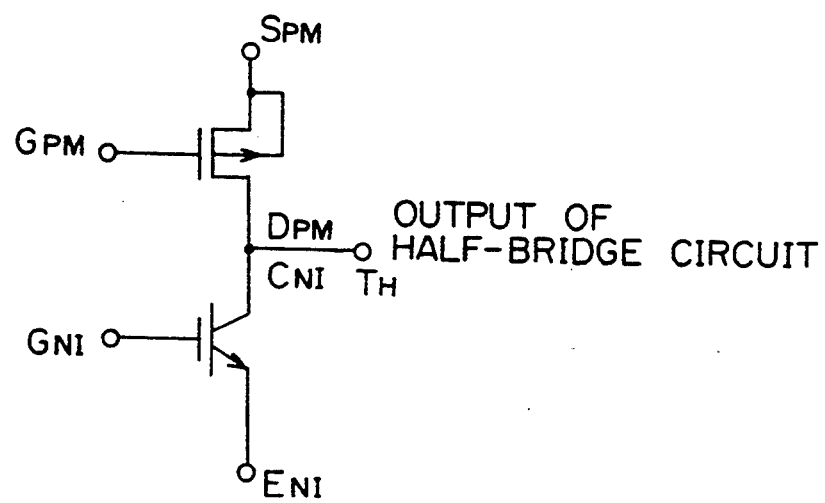
FIG. 14B shows an equivalent circuit.

FIG. 14A shows the sectional view of the internal structure of the semiconductor device according to the third embodiment, and FIG. 14B shows an equivalent circuit.

As shown in FIG. 14A, a $p^-$-type area 52 is formed by applying, for example, an epitaxial growth over a $p^+$-type substrate 51 such as silicon, etc. The $p^-$-type area 52 is divided into two $p^-$-type areas 52a and 52b by a $p^+$-type area 53, providing an isolation layer.

Then, a silicon oxide film 54 is formed with its surface oxidized over the $p^+$-type substrate 51 incorporating the $p^-$-type area 52 and the $p^+$-type area 53.

An n-type area 55 is formed, for example, by being diffused from above the $p^-$-type area 52a. Furthermore, a predetermined depth of a $p^+$-type area 56 is formed over the n-type area 55.

That is, a vertically-structured p-channel MOS (hereinafter referred to as a p-MOS) is formed on one area of the $p^+$-type substrate 51 with the n-type area 55 as a body, the p+-type area 56 as a source area, and the p+-type substrate 51 as a drain area.

Then, a gate electrode 57 is formed on the silicon oxide film 54 over the n-type area 55 with the contact of the silicon oxide film 54 used as a gate oxide film according to, for example, a vacuum deposition method, etc. using aluminum as described above.

Additionally, a source electrode 58 is formed well over the p+-type area 56 exposed from the opening of the silicon oxide film 54 according to, for example, a vacuum deposition method, etc. using aluminum as described above.

Furthermore, an n-type area 60 is formed, for example, by being diffused over the p⁻-type area 52b on the other area of the p+-type substrate 51. Then, a predetermined depth of a p-type area 61 is formed over the n-type area 60, and a predetermined depth of an n+-type area 62 is formed over the p-type area 60.

Thus, a vertically-structured n-channel IGBT (hereinafter referred to as an n-IGBT) is formed on the other area of the p+-type substrate 51, comprising the p+-type substrate 51 as a p collector area, the n-type area 60 as an n base area, the p-type area 61 as a p base area, and the n+-type area 62 as an n emitter area. The p+-type substrate 51 is a drain/p collector common area used as a drain area of the p-MOS and a p collector area of the n-IGBT.

Then, a gate electrode 63 is formed on the silicon oxide film 54 over the p-type area 61 with the contact of the silicon oxide film 54 used as a gate oxide film according to, for example, a vacuum deposition method, etc. using aluminum as described above.

Additionally, an emitter electrode 64 is formed well over the n+-type area 62 exposed from the opening of the silicon oxide film 54 according to, for example, a vacuum deposition method, etc. using aluminum as described above.

Furthermore, an electrode 65 is formed over the reverse surface of the p+-type substrate 51 according to a vacuum deposition method, etc. using aluminum as described above. The electrode 65 is a drain electrode of the p-MOS and a collector electrode of the n-IGBT.

A gate terminal $G_{PM}$ and a source terminal $S_{PM}$ are respectively connected to the gate electrode 57 and the source electrode 58. Likewise, a gate terminal $G_{NI}$ and an emitter terminal $E_{NI}$ are respectively connected to the gate electrode 63 and the emitter electrode 64. Furthermore, a common terminal $T_H$ to be used as a drain terminal $D_{PM}$, collector terminal $C_{NI}$, and half-bridge output terminal is obtained from the electrode 65.

As indicated by the equivalent circuit shown in FIG. 14B, the upper arm is formed by a vertically-structured p-MOS, and the lower arm is formed by a vertically-structured n-IGBT. Then, an output of the half-bridge circuit can be obtained through the common terminal $T_H$ extended from the connection point between the drain terminal $D_{PM}$ and the collector terminal $C_{NI}$.

The third embodiment has the opposite correspondence of the upper and lower arms to the IGBT and the MOS of the second embodiment, and the second and third embodiments further have reversed conductor types of IGBT and MOS from each other.

Next, according to the third embodiment, the operation of isolating the p-MOS from the n-IGBT is explained briefly.

In the equivalent circuit shown in FIG. 14B, assume that the p-MOS is an upper arm and in an "on" state, and the n-IGBT is a lower arm and in an "off" state. At this time, the configuration is almost the same as that shown in FIG. 11A except that the conductor types for the IGBT and the MOS are reversed from the device shown in FIG. 11A.

In FIG. 14A, a depletion layer is formed around the pn connection between the n-type area 60 and the p-type area 61, and the upper arm is electrically isolated from the lower arm.

In the equivalent circuit shown in FIG. 14B, assume that the p-MOS is an upper arm and in an "off" state, and the n-IGBT is a lower arm and in an "on" state. At this time, the conductor types are reversed from the device shown in FIG. 7A. In FIG. 14A, a depletion layer is formed around the pn connection between the n-type area 55 and the p-type area 52a, and the upper arm is electrically isolated from the lower arm.

When both upper and lower arms are in an "off" state, the configuration is almost the same as that shown in FIG. 12. In this case, the upper arm is also electrically isolated from the lower arm.

Additionally, the p+-type area 53 is formed to suppress leakage current generated by the incidental npn structure formed between the n-type area 60 and the p-type area 52 of the n-IGBT, and the n-type area 55, that is, the body of the p-MOS.

Furthermore, the p⁻-type area 52b is formed to suppress leakage current generated by the incidental pnp structure formed between the p+-type substrate 51, the common drain/p-collector area and the n-type area 60, and the p-type area 61.

The leakage-current Controlling operation has been described before, and is not explained in detail here.

According to the third embodiment of the present invention, a half-bridge circuit comprises a vertically-structured p-MOS and n-IGBT an as a single semiconductor.

In this case, unlike the second embodiment, the third embodiment cannot incorporate a control circuit. However, since neither the upper nor lower arm is horizontally structured, the entire circuit provides excellent in area efficiency. Additionally, the circuit, requiring no specific layer for electrically isolating the upper arm from the lower arm, can be structured as a small unit, thereby reducing production cost. Furthermore, since no arms are horizontally structured, the performance of the entire device does not result in deterioration of the current amplification factor or current capacity. Therefore, the upper and lower arms provide efficiency, and effectively suppress leakage current.

Furthermore, since both the upper and lower arms incorporate voltage control elements, improved switching capabilities are realized, thereby reducing electricity consumption and enabling a CPU to directly drive the circuit according to the input through the TTL.

It is obvious that the present invention is not limited to the form presented by the above described embodiments, but can be realized in various configurations.

What is claimed is:

1. A semiconductor device including a half-bridge circuit on a single semiconductor chip comprising:
    a vertically-structured p-channel insulated gate bipolar transistor forming an upper arm of the half-bridge circuit, said transistor comprising: an n-collector area, a p-base area, an n-base area and a p-emitter area; and
    a vertically-structured n-channel metal-oxide-silicon transistor forming a lower arm of the half-bridge circuit, said metal-oxide-silicon transistor comprising: a p-body area, an n-type source area and an n-type drain area;

a shared n-type common area providing said n-collector area of the insulated gate bi-polar transistor and said n-type drain area of the metal-oxide-silicon transistor;

a first n-type isolation area formed on said n-type common area separating said p-base area of the insulated gate bi-polar transistor from said common area;

a second n-type isolation area formed within said first n-type isolation area, the n-type of the first and second isolation areas differing from each other, and said second n-type isolation area dividing said first n-type isolation area into two sections which separate said p-base of the insulated gate bi-polar transistor from said p-body area of the metal-oxide-silicon transistor.

2. The semiconductor device according to claim 1, wherein said first isolation area has an impurity density lower than that of said common area; and 3. The semiconductor device according to claim 1, wherein a control circuit comprising a complementary metal-oxide-silicon (CMOS) logic device is integrated within said single semiconductor chip.

said second isolation area has an impurity density higher than that of said first isolation area.

4. A semiconductor device comprising:

a vertically-structured p-channel insulated gate bi-polar transistor forming an upper arm of a half-bridge circuit; and a vertically-structured n-channel metal-oxide-silicon transistor forming a lower arm of said half-bridge circuit;

said p-channel insulated gate bi-polar transistor and said n-channel metal-oxide-silicon transistor being disposed adjacently on a semiconductor substrate;

said p-channel insulated gate bi-polar transistor comprising:

an n-type collector area which is a common area shared with said n-channel metal-oxide-silicon transistor;

a first isolation area which is an n-type low impurity density area provided on a first surface of said common area;

a p-type base area provided on a surface of said first isolation area, said first isolation area separating said p-type base area from said common area;

an n-type base area provided on a surface of said p-type base area; and a p-type emitter area provided on a surface of said n-type base area; and said n-channel metal-oxide-silicon transistor comprising:

an n-type drain area which corresponds to the common area shared with said p-channel insulated gate bi-polar transistor;

an n-type intermediate area provided on a second surface of said common area adjacent said first surface;

a second isolation area, which is an n-type high impurity density area, for isolating said n-type intermediate area from said p-type base area;

a p-type body area provided on a surface of said n-type intermediate area; and an n-type source area provided on a surface of said body area.

* * * * *

UNITED STATES PATENT AND TRADEMARK OFFICE
CERTIFICATE OF CORRECTION

PATENT NO. : 5,442,219
DATED : August 15, 1995
INVENTOR(S) : M. Kato

It is certified that error appears in the above-indentified patent and that said Letters Patent is hereby corrected as shown below:

On the title page:
In the Abstract, line 21, "circuit" should read --circuits--.

Column 2, line 22, "$a^n$" should read --an--;
 line 52, remove second period after "reduction";
 line 53, after "effective" delete "merit";
 line 54, delete "cannot" insert --performance could not--.

Column 3, line 8, after "primary" delete comma, insert hyphen -- - --; line 15, after "common" insert --area.--; line 17, "Ion" should read --on--.

Column 4, line 16, after "suppress" delete "a".

Column 5, line 46, "then-type" should read --the n-type--.

Column 6, line 14, "potentials" should read --potential--;
 line 17, after "transistor" delete "is, a" insert --the--.

UNITED STATES PATENT AND TRADEMARK OFFICE
CERTIFICATE OF CORRECTION

PATENT NO. : 5,442,219
DATED : August 15, 1995
INVENTOR(S) : M. Kato

It is certified that error appears in the above-indentified patent and that said Letters Patent is hereby corrected as shown below:

Column 7, line 37 delete "in".

Column 9, line 58, "n-collector" should read --n collector--; line 63 "drain/-n" should read --drain/n--.

Column 12, line 12 "At., this" should read --At this--; line 31, "Controlling" should read --controlling--; line 35, after "and" insert --an--; after "n-IGBT" delete "an"; line 40, delete "in".

Column 13, after "and" in line 25 insert --said second isolation area has an impurity density higher than that of said first isolation area--; delete lines 31 and 32.

Signed and Sealed this

Twenty-sixth Day of December, 1995

Attest:

BRUCE LEHMAN

*Attesting Officer*       *Commissioner of Patents and Trademarks*